(12) United States Patent
Khoury

(10) Patent No.: US 6,440,775 B2
(45) Date of Patent: Aug. 27, 2002

(54) METHOD AND APPARATUS FOR EDGE CONNECTION BETWEEN ELEMENTS OF AN INTEGRATED CIRCUIT

(75) Inventor: Theodore A. Khoury, Evanston, IL (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/885,000

(22) Filed: Jun. 21, 2001

Related U.S. Application Data

(60) Division of application No. 09/670,107, filed on Sep. 26, 2000, now Pat. No. 6,369,445, which is a continuation-in-part of application No. 09/596,437, filed on Jun. 19, 2000, now Pat. No. 6,343,940.

(51) Int. Cl.[7] .............................................. H01L 21/44
(52) U.S. Cl. ...................... 438/107; 438/109; 438/110
(53) Field of Search ............................... 438/107, 108, 438/109, 110

(56) References Cited

U.S. PATENT DOCUMENTS

| | | |
|---|---|---|
| 4,990,462 A | 2/1991 | Sliwa, Jr. |
| 5,006,920 A | 4/1991 | Schafer et al. |
| 5,343,075 A | 8/1994 | Nishino |
| 5,435,734 A | 7/1995 | Chow |
| 5,517,057 A | 5/1996 | Beilstein, Jr. et al. |
| 5,539,246 A | 7/1996 | Kapoor |
| 5,552,633 A | 9/1996 | Sharma |
| 5,559,316 A | 9/1996 | Tomoda |
| 5,623,160 A | 4/1997 | Liberkowski |
| 5,625,221 A | 4/1997 | Kim et al. |
| 5,834,843 A | 11/1998 | Mori et al. |
| 5,838,060 A | 11/1998 | Comer |
| 5,936,840 A | 8/1999 | Satwinder |
| 5,973,403 A | 10/1999 | Wark |
| 6,008,530 A | 12/1999 | Kano |
| 6,020,620 A | 2/2000 | Kusakabe |
| 6,023,097 A | 2/2000 | Chiang et al. |
| 6,075,288 A | 6/2000 | Akram |
| 6,343,940 B1 * | 2/2002 | Khoury et al. ................. 439/66 |
| 6,369,445 B1 * | 4/2002 | Khoury ....................... 257/723 |

FOREIGN PATENT DOCUMENTS

| | | |
|---|---|---|
| JP | 03-163861 | 7/1991 |
| JP | 4-76056 | 7/1992 |
| JP | 06-196626 | 7/1994 |
| JP | WO 99/12207 | 3/1999 |
| JP | 11-168172 | 6/1999 |
| JP | 2000-260931 | 9/2000 |

* cited by examiner

Primary Examiner—Kevin M. Picardat

(57) ABSTRACT

An integrated circuit (IC) having a plurality of IC modules, each IC module having attachment surfaces to which elements of the IC are attached, and each IC module having interlocking edges adjacent to the attachment surface. The interlocking edges of adjacent IC modules are interlocked to form a structural connection between the IC modules. The interlocking edges are a plurality of teeth and recesses, which are arranged in rows. The teeth are securely received by a respective recess in an adjacent interlocking edge to create a structural connection between adjacent IC modules. In addition, the interlocking edges can be a ridge member or a ridge recess, where the ridge member or ridge recess is securely received by a respective ridge recess or ridge member of an adjacent IC module to create a structural connection between the IC modules. The interconnection edge can also be a combination of the ridge member, ridge recess, and/or the rows of teeth and recesses. The attachment surfaces of adjacent IC modules can be co-planar and non-planar, depending on the shape desired. The elements on the IC modules communicate using external pathways and/or internal pathways using conventional wire-bond techniques or using conductive layers within the IC module. The IC module is formed of conventional Si wafers. Using this configuration, an IC can be constructed that utilizes less real estate, fits in non-planar spaces in a housing, and has improved speed due to reduced pathway lengths.

5 Claims, 8 Drawing Sheets

METHOD AND APPARATUS FOR EDGE CONNECTION BETWEEN ELEMENTS OF AN INTEGRATED CIRCUIT

CROSS-REFERENCE TO RELATED APPLICATIONS

This application is a divisional of application Ser. No. 09/670,107, filed Sep. 26, 2000, now U.S. Pat. No. 6,369,445 which is a continuation-in-part application of Ser. No. 09/596,437, filed Jun. 19, 2000, now U.S. Pat. No. 6,343,940 in the U.S. Patent and Trademark Office, the disclosures of which are incorporated herein by reference.

BACKGROUND OF THE INVENTION

1. Field of the Invention

This invention relates to the field of integrated circuits, and in particular, to constructing smaller and more efficient integrated circuits using integrated circuit modules to create shorter connection paths between elements, and to customize the shape of the completed integrated circuit in order to use real estate more efficiently.

2. Description of the Related Art

In creating an integrated circuit (IC), various elements, such as logic and memory, need to be combined to provide the desired functionality for the IC. However, as the number of elements in an IC increases, the size of the IC wafer itself increases. In addition, as the size of the wafer increases, the elements of the IC have longer pathways between the elements, increasing the communication time between the elements and thus decreasing the overall speed of the IC. Thus, there is a need to arrange the wafers to accommodate all elements without increasing the size of the wafer.

One solution is to create IC modules, where the IC modules are combined to create the overall IC. Each IC module has an element attached to an individual wafer, and the IC modules are arranged to reduce the real estate used by the IC, or reduce the pathway lengths between elements. The IC modules are electrically connected at the edges, but are structurally connected either to a common carrier substrate below the IC modules or bonded flush at the edges. This method requires either the use of an additional wafer for use as a carrier substrate, and/or the use of toxic adhesives to bond the IC module wafers together to create a final IC. In addition, the ability to customize the shape of the completed IC is compromised since the overall shape of the completed IC is governed by the shape of the carrier substrate, or by the planar shape of the IC modules, leading to both longer pathways, thus decreasing the overall speed of the IC, and the IC taking up more real estate than is otherwise necessary.

A second solution is to stack the IC modules vertically, with the elements being electrically interconnected through pathways along the edge of the stack or through the center of the stack. This solution results in taller ICs, often resembling cubes, which take up more vertical air space, but less horizontal real estate in a housing. However, these stacked IC modules still require the use of toxic adhesives and other bonding techniques in order to structurally connect the IC modules. In addition, these stacked IC modules have problems cooling the IC elements at the center of these stacks. Lastly, the size of the completed stack still utilizes more real estate than is necessary, only in three dimensions instead of two, and also is not conformable to the shape of the housing.

As a result, the prior solutions lack the capacity to provide structural, positive connections between edges of IC modules, thus requiring the use of adhesives and additional carrier substrates. In addition, the prior solutions only teach reducing the real estate taken up by the IC by vertically stacking the IC modules, which results in taking up vertical air space and results in cooling problems. Lastly, the prior solutions do not suggest how to construct an IC using IC modules to conform the IC to non-rectangular, out-of-plane shapes in the housing.

SUMMARY OF THE INVENTION

An object of the present invention is to create a positive structural connection between IC modules using interlocking edges so as to allow for the creation of an IC having irregular shapes allowing for a greater reduction in real estate used by the IC within a housing.

A further object of the present invention to create a modular IC wherein the IC modules can be arranged such that, in combination with the use of external and/or internal pathways, to optimize the pathway lengths between elements resulting in decreased communication times and an increased speed for the IC.

A still further object of the invention is to provide a modular IC using interlocking edges to create a non-planar IC by connecting the IC modules at angles relative to the attachment surfaces of the IC modules.

Additional objects and advantages of the invention will be set forth in part in the description which follows and, in part, will be obvious from the description, or may be learned by practice of the invention.

To accomplish the above and other objectives, an IC module has an attachment surface suitable for attachment of an element, a first interlocking edge adjacent to the respective attachment surface, wherein the first interlocking edge is sized to be securely received by a respective interlocking edge of an adjacent IC module or other device forming a structural connection.

When combined with other IC modules, a preferred embodiment of the present invention provides for an IC that has a plurality of first and second IC modules, a plurality of elements attached to a respective attachment surface of a respective IC module, each first IC module comprising a first interlocking edge adjacent to the respective attachment surface, each second IC module comprising a second interlocking edge adjacent to the respective attachment surface, wherein each first IC module is structurally connected to a respective second IC module by interlocking the first interlocking edge of the first IC module with the second interlocking edge of the respective second IC module since the first interlocking edge is sized to be securely received by the second interlocking edge, and where the elements are in communication with each other.

To create the IC using IC modules, another preferred embodiment of the present invention is directed to a method of connecting IC modules, each IC module having an interlocking edge adjacent to an attachment surface, and an element attached to the attachment surface, the method including connecting the interlocking edges of the IC modules to create a structural connection, and connecting the elements on the to allow the to communicate.

In an embodiment of the present invention, the interlocking edges are a plurality of teeth and recesses, wherein the teeth of one interlocking edge are securely received by the respective teeth of the another interlocking edge so as to create a structural connection between the IC modules.

In yet another embodiment of the present invention, the interlocking edges are ridge members or ridge recesses, wherein the ridge member of one interlocking edge is securely received by the respective ridge recess of the another interlocking edge so as to create a structural connection between adjacent IC modules.

In yet a further embodiment of the present invention, the integrated circuit modules are combined such that attachment surfaces of adjacent integrated circuit modules define an angle, where this angle is determined based upon the size of a housing for the IC, and by the optimal pathway between elements on the IC.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
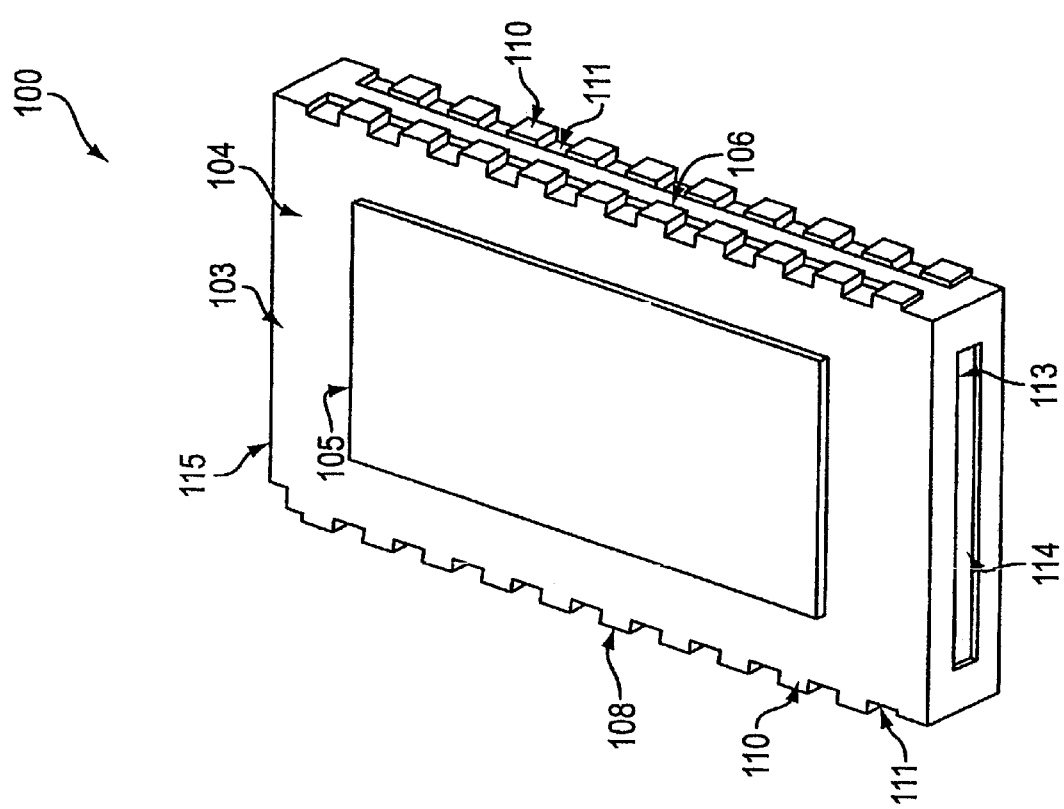
FIG. 1 is a perspective view of an IC module according to an embodiment of the present invention.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
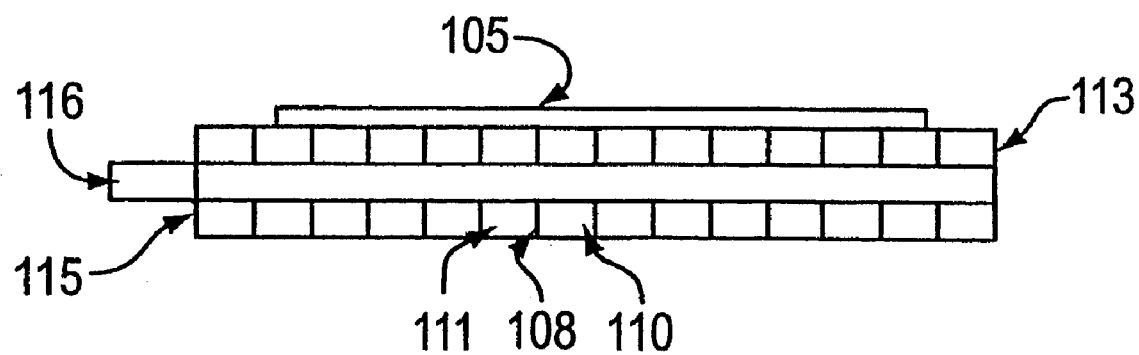
FIG. 2 is a side view of an interlocking edge showing the rows of teeth and ridge members according to an embodiment of the present invention.

FIGS. 1 and 2 show the integrated circuit (IC) module 100 according to a preferred embodiment of the present invention. IC module 100 includes a wafer 103, to which an element 105 is attached at an attachment surface 104. The wafer 103 is designed to complement the size of the element 105 attached to it. The wafer 103 is generally rectangular, and is made from Si, although it is understood that other shapes and materials, such as glass, GaAr, and SiGe, could also be employed.

Along the sides of wafer 103, there are sets of interlocking edges 106 and 108, and 113 and 115. Interlocking edges 106 and 108 are composed of rows of teeth 110 with recesses 111 disposed between adjacent teeth 110. The recesses 111 of interlocking edge 106 are sized to securely receive the respective teeth 110 of an adjacent interlocking edge (not shown) to create a structural connection.

Interlocking edges 113 and 115 are composed of respective female and male members. The female member of interlocking edge 113 is a ridge recess 114. The male member of interlocking edge 115 is ridge member 116. Ridge recess 114 is sized to securely receive the ridge member of an adjacent interlocking edge (not shown) to create a third structural connection.

One such wafer 103 is disclosed in Ser. No. 09/596,437, filed Jun. 19, 2000 in the U.S. Patent and Trademark Office, the disclosure of which is incorporated herein by reference.

It should be noted that other shapes are possible for interlocking edges, such as dovetail-channel connections, or "puzzle style" edges so long as the interlocking edges have shapes that intermesh to allow for one IC module to positively lock/mate with a second IC module to form a structural connection. In addition, the layers for these shapes may or may not extend through the entire edge of the substrate so long as this structural connection is formed.

The interconnection edges 106, 108, 113, 115 on wafer 103 are preferably formed using deep reactive ion etching. However, other methods of imparting these features include ion micromilling or other etching techniques, forming the wafers with the desired interlocking edges, or adhering pre-prepared strips of interlocking edges onto edges of the wafer 103. During etching, break away tabs (not shown) may be used at the corners to restrain the wafer 103 during etching.

Figure 3:
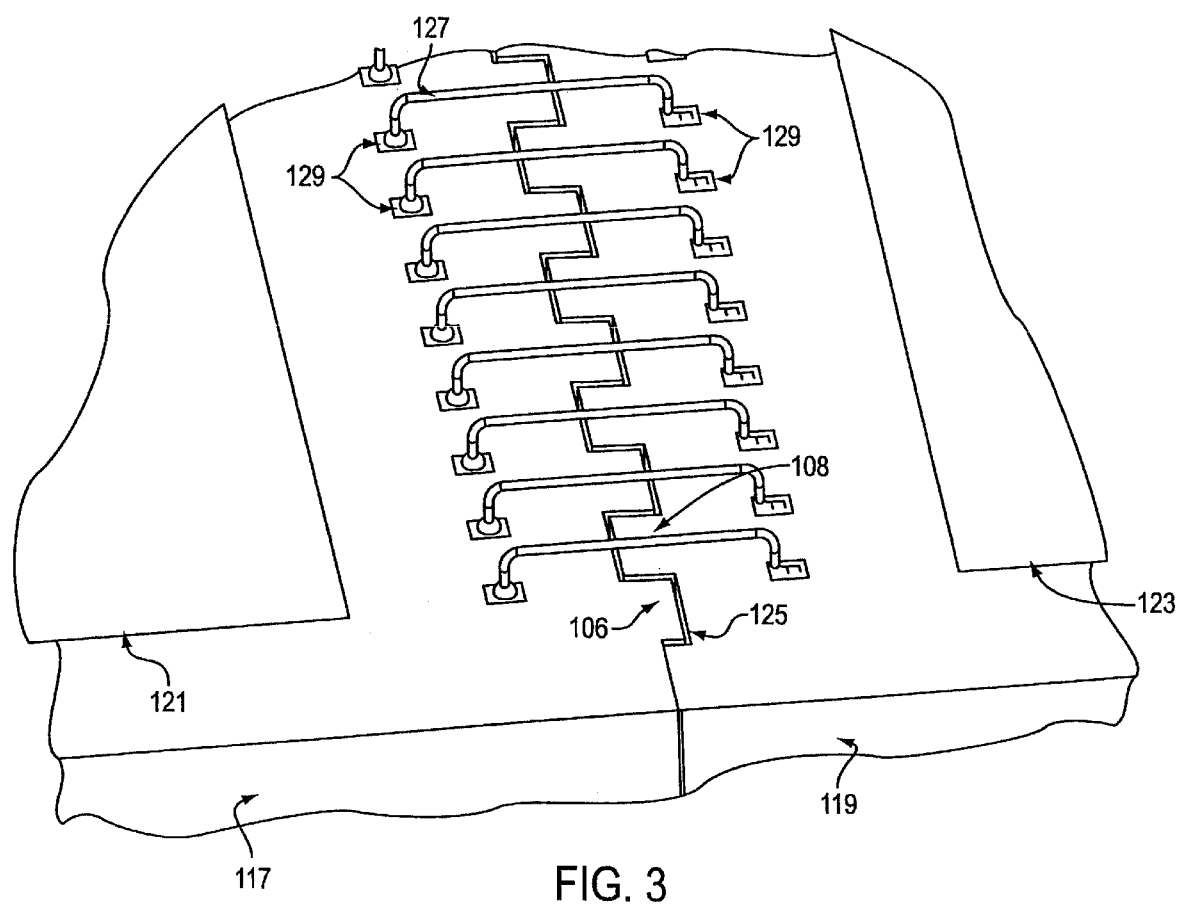
FIG. 3 is a perspective view of a junction between interlocking edges and a wire-bond attachment between elements on adjacent IC modules according to an embodiment of the present invention.

As shown in FIG. 3, the IC modules 100 are connected structurally and electrically at junction 125. The interlocking edge 106 of a first wafer 117 is locked to the interlocking edge 108 of a second wafer 119 to form a positive structural connection at junction 125. While this junction 125 may be entirely structural and rely on the locking action of the interlocking edges 106 and 108, the strength of junction 125 can be augmented using standard adhesive techniques to increase the strength of the connection. The element 121 is electrically connected to element 123 through bond pads 129 and wires 127, which creates external pathways to allow communication between the elements 121 and 123.

Figure 4:
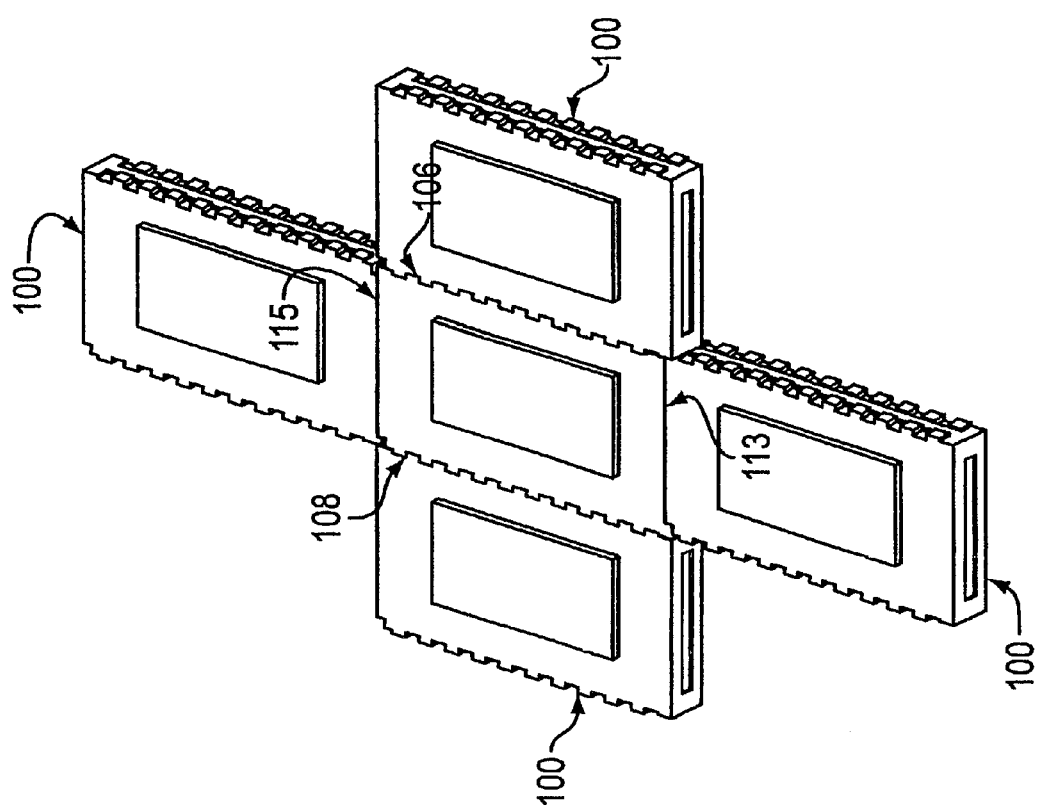
FIG. 4 is a perspective view of a configuration of IC modules according to an embodiment of the present invention where the attachment surfaces are coplanar.

As shown in FIG. 4, by utilizing the interlocking edges 106, 108, 113, and 115, numerous IC modules 100 can be connected along a single plane without the use of a carrier substrate (IC elements and electrical connections not shown).

Figure 5:
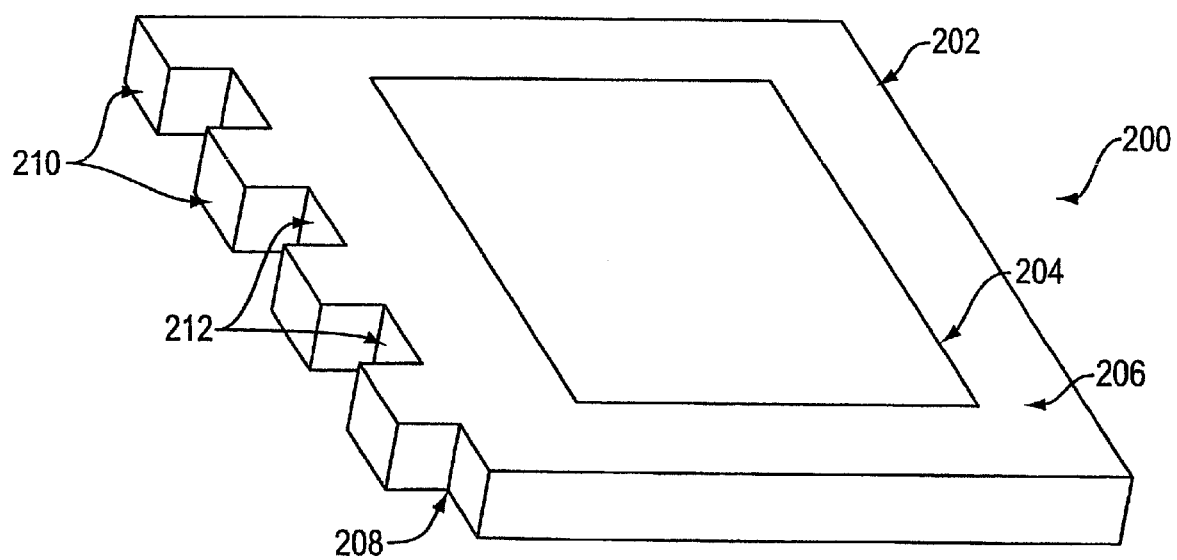
FIG. 5 is a perspective view of an IC module according to another embodiment of the present invention where the interlocking edge is a single row of teeth.

FIG. 5 shows an IC module 200 of another embodiment of the present invention. IC module 200 includes a wafer 202, to which an element 204 is attached at the attachment surface 206. At the interlocking edge 208, a single row of teeth 210, with recesses 212 disposed between adjacent teeth 210, provides the locking mechanism. The recesses 212 are sized so as to securely receive the respective teeth 210 of an adjacent IC module (not shown).

Figure 6:
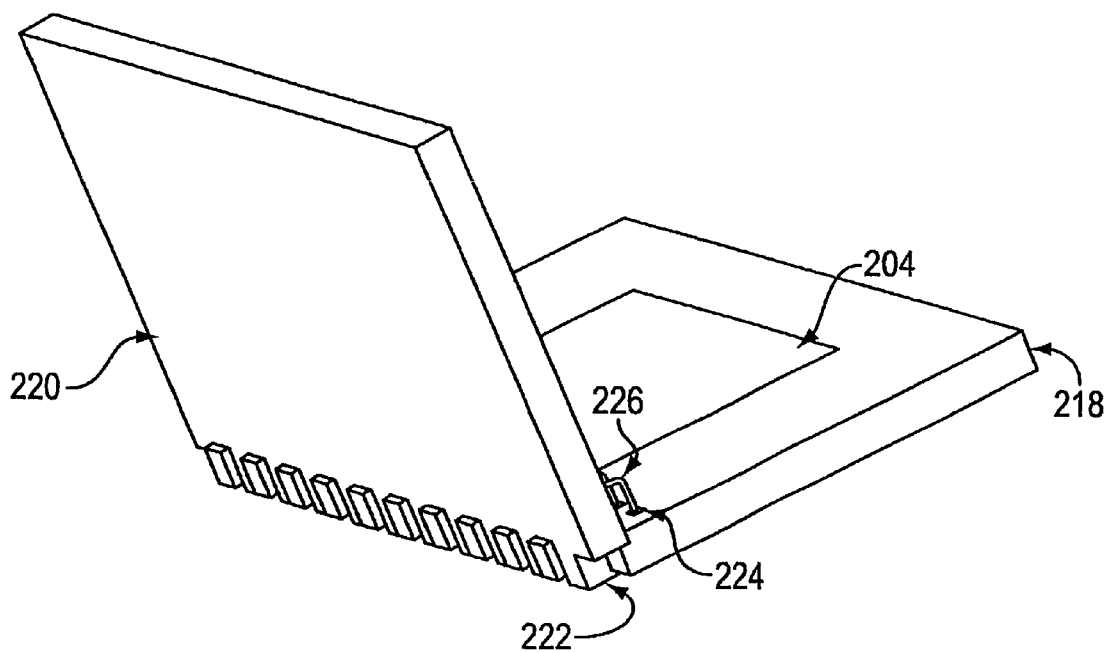
FIG. 6 is a perspective view of a junction between adjacent IC modules according to an embodiment of the present invention where the attachment surfaces define an angle.

FIG. 6 shows the structural and electrical connection of first and second IC modules 218 and 220 according to another embodiment of the present invention. The interlocking edge 208 of the first IC module 218 is interlocked to the respective interlocking edge 208 of the second IC module 220 to form a positive connection at junction 222. This junction 222 may be entirely structural and rely on the locking action of the interlocking edges 208, or can be augmented using standard adhesive techniques to increase the strength of the connection. In addition, element 204 of the first IC module 218 is electrically connected to element 205 (not shown) of the second IC module 220 through bond pads 224 and wires 226, which create external pathways to allow communication between elements 204 and 205. Using this arrangement, the IC modules 200 can be interconnected at the edges in non-planar arrangements, such as the "L" shapes shown in FIG. 6.

Figure 7:
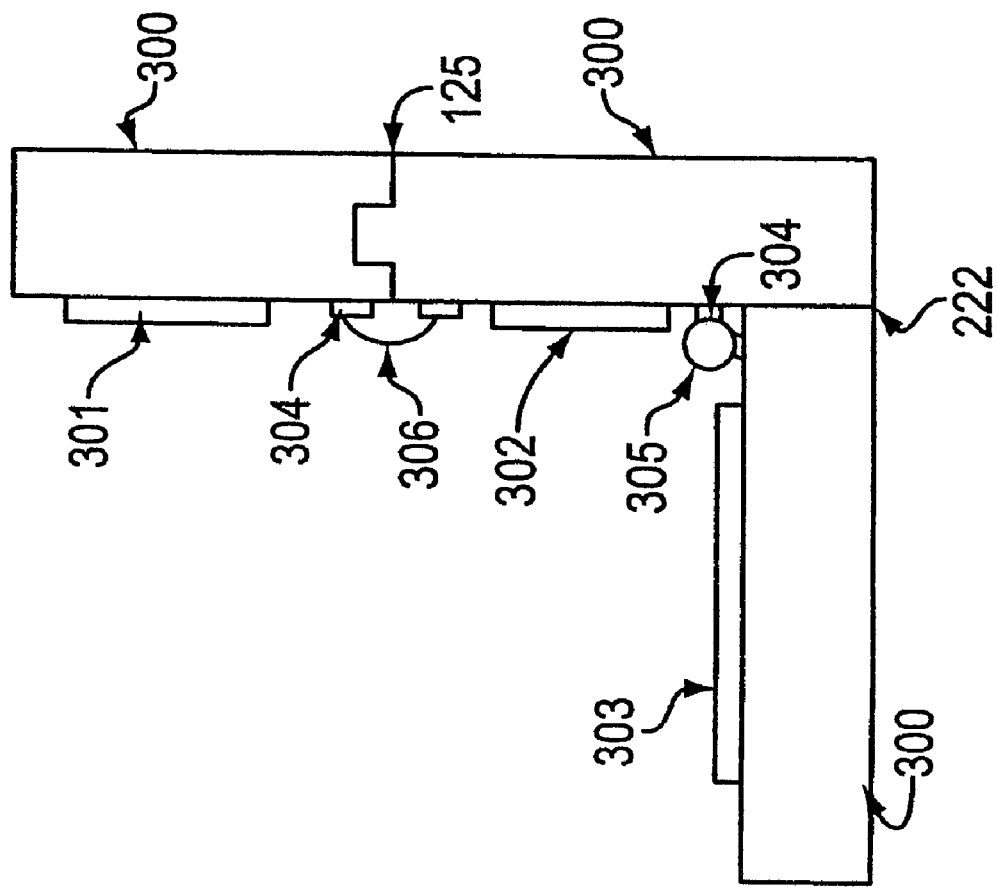
FIG. 7 is a side view of a combination of junctions between IC modules defining an extended "L" shaped IC according to an embodiment of the present invention.

FIG. 7 shows a further embodiment of the present invention in which IC modules 300 are structurally and electrically connected in an extended "L" shape. The IC modules utilize a combination of junctions 222 and 125 in order to form both planar and non-planar edge connections. In addition, the elements 301, 302, 303 are electrically interconnected using bonds 304 and wires 306, which create external pathways to allow communication between elements 302. The electrical connection between elements 302 and 303 can also be accomplished by bonding balls 305 between bond pads 304.

Figure 8:
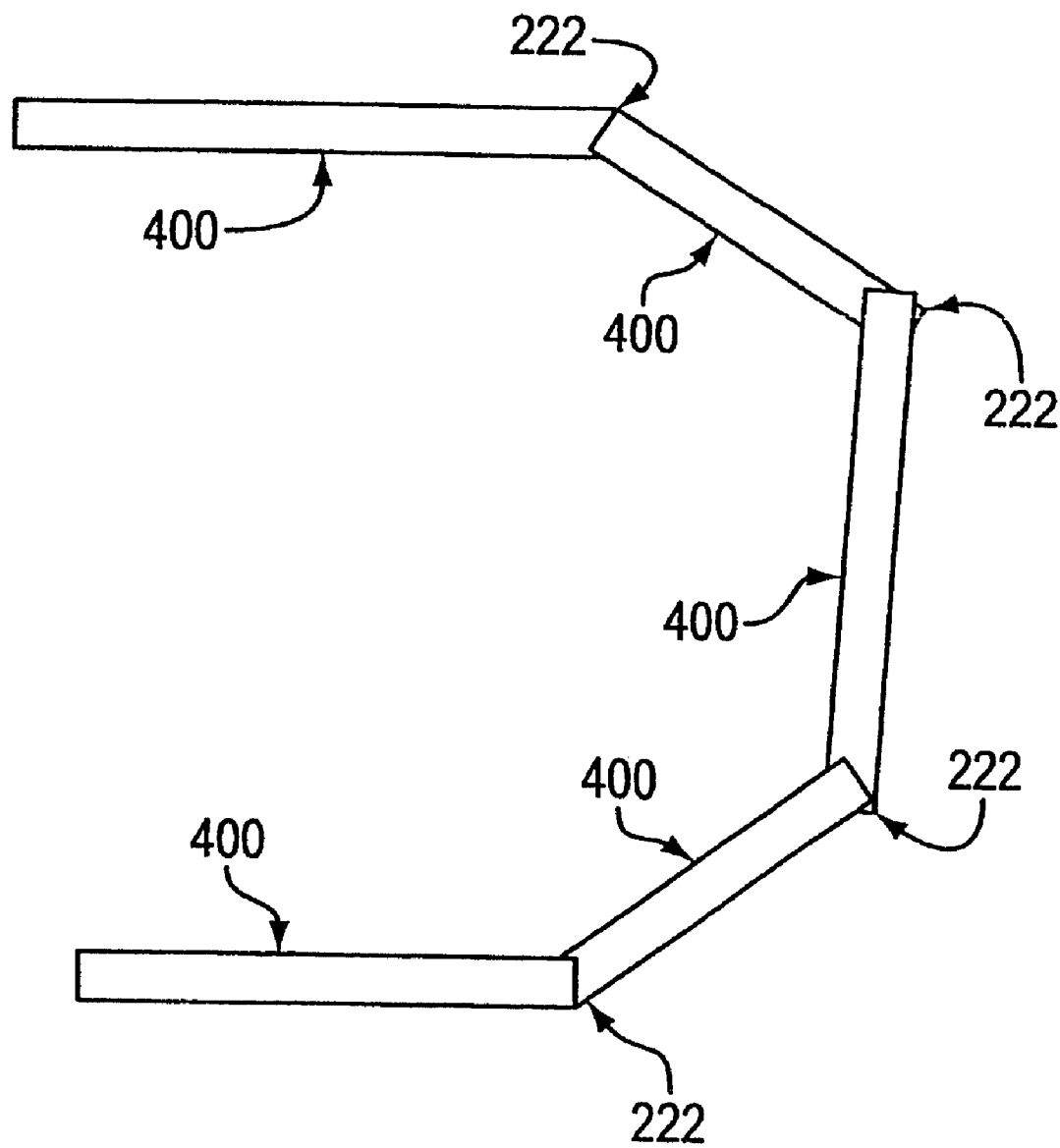
FIG. 8 is a side view of a combination of junctions between IC modules defining a "U" shaped IC according to an embodiment of the present invention.

FIG. 8 shows yet another potential shape realized by IC modules 400 using junctions 222 (elements and electrical connections not shown) according to another embodiment of the present invention.

It is understood that a myriad of shapes can be realized by arranging IC modules at angles. Further, the IC modules can be arranged so as to minimize the real estate occupied by the IC within a housing, or to mold the IC to conform to a particular shape within the housing. In addition, by arranging the IC modules, those elements needing the greatest heat dissipation may be arranged to achieve that dissipation without significantly increasing the size of the IC, as a whole. Lastly, by arranging the IC modules, an optimal pathway between elements can be created as to create the most efficient communication scheme between the elements.

In order to interconnect the IC modules according to the preferred embodiment of the present invention, adjacent IC modules are aligned such that their corresponding interlocking edges are disposed to securely receive each other to create a structural connection between the IC modules, and then the IC modules are combined to form a junction. The elements on the IC modules are connected, either internally or externally, to complete the integrated circuit. The IC modules can be connected such that the shape of the completed IC is defined using the shape of the housing and the optimal pathway between elements on the IC, where the optimal pathway is the pathway, internal and/or external to the IC, that creates the most efficient communication scheme between the elements.

In other embodiments of the present invention, the elements on the IC modules communicate either using internal pathways, or through a combination of internal and external pathways. For internal pathways, the IC module wafers have an internal conductive layer used to define the pathways. These internal pathways extend through the interlocking edge connections, enabling the creation of an internal pathway connection between elements on the IC modules. For external connections, in addition to the wire and bond path method disclosed above, the elements could also be connected using standard connection techniques such as through wire bonding, or tape automated bonding. Since the IC modules do not need to be coplanar or in a stacked relationship, the shortest path between elements can be created by tilting the IC modules relative to one another and using external pathways in addition to internal pathways.

It is understood that, while the disclosed elements communicate electronically, elements can communicate using other signals, such as optical signals, instead of or in addition to the electrical connections discussed in the above embodiments.

In another embodiment of the present invention, the wafers of adjacent IC modules can be made from different materials having different material properties. In this case, a buffer can be employed to account for these different material properties, such as varying rates of thermal expansion, in order to ensure a solid structural connection between the IC modules.

In yet another embodiment of the present invention, existing IC modules, perhaps obtained from different manufacturers, are modified to add interlocking edges so as to directly combine the elements. The interlocking edges can either be directly integrated into the wafer of the IC module, or can be added from strips of interlocking edges attached to the edges of the IC module using standard adhesive techniques. In this way, existing wafers can be adapted to employ the present invention without having to reattach the element on an new wafer having the interlocking edges.

In a further embodiment of the present invention, the interlocking edges could be used to connect an IC created using the IC modules to external devices, such as sensors, actuators, transmitting devices, display devices, optical components, waveguide transmission devices, nozzles/valves or any other device to which an IC needs to connected. According to this embodiment, the external device would include an interlocking edge to which an interlocking edge of an IC module would be structurally connected so as to attach the external device to the IC.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of connecting integrated circuit modules, each module having an interlocking edge adjacent to an attachment surface, and an integrated circuit element attached to the attachment surface, comprising:

connecting the interlocking edges of the integrated circuit modules, the interlocking edges being sized to be securely received by an adjacent interlocking edge so as to create a structural connection between adjacent integrated circuit modules; and connecting the integrated circuit elements to allow the integrated circuit elements to communicate.

2. The method of connecting integrated circuit modules of claim 1, wherein each interlocking edge comprises a plurality of teeth and a plurality of recesses, each recess disposed between adjacent teeth and sized to securely receive a respective tooth of an adjacent interlocking edge, wherein said connecting the interlocking edges further comprises:

aligning the teeth and respective recesses of the interlocking edges; and combining the teeth and respective recesses of the interlocking edges such that a structural connection is formed.

3. The method of connecting integrated circuit modules of claim 1, wherein the integrated circuit modules comprise a plurality of first and second integrated circuit modules, wherein the interlocking edge of each first integrated circuit module further comprises a ridge member, and the interlocking edge of each second integrated circuit module further comprises a recess sized to securely receive the ridge, and wherein said connecting the interlocking edges further comprises:

aligning each ridge member with a respective recess; and combining the ridge member and the respective recess such that a structural connection is formed.

4. The method of connecting integrated circuit modules of claim 1, wherein said connecting comprises determining angles between the attachment surfaces of adjacent integrated circuit modules;

connecting the interlocking edges of adjacent integrated circuit modules at the determined angle to form a structural connection.

5. The method of connecting integrated circuit modules of claim 4, wherein the angles are determined based upon the shape of a housing in which integrated circuit modules are housed, and/or an optimal pathway between the integrated circuit elements, wherein the optimal pathway is the most efficient combination of pathways, internal or external to the integrated circuit modules, that allows the integrated circuit elements to communicate with each other.

* * * * *

UNITED STATES PATENT AND TRADEMARK OFFICE
CERTIFICATE OF CORRECTION

PATENT NO. : 6,440,775 B2
DATED : August 27, 2002
INVENTOR(S) : Ted A. Khoury

It is certified that error appears in the above-identified patent and that said Letters Patent is hereby corrected as shown below:

<u>Column 7,</u>
Lines 4-10, please re-type claim 4 as follows:

-- 4. The method of connecting integrated circuit modules of claim 1, wherein said connecting comprises
determining angles between the attachment surfaces of adjacent integrated circuit modules;
connecting the interlocking edges of adjacent integrated circuit modules at the determined angle to form a structural connection. --

Signed and Sealed this

Twenty-fifth Day of March, 2003

JAMES E. ROGAN
*Director of the United States Patent and Trademark Office*